(12) United States Patent
Chen

(10) Patent No.: US 9,274,893 B2
(45) Date of Patent: Mar. 1, 2016

(54) DATA STORAGE DEVICE AND ERROR CORRECTION METHOD THEREOF

(71) Applicant: Silicon Motion, Inc., Jhubei, Hsinchu County (TW)

(72) Inventor: Chun-Yi Chen, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 55 days.

(21) Appl. No.: 14/271,928

(22) Filed: May 7, 2014

(65) Prior Publication Data

US 2014/0359346 A1 Dec. 4, 2014

Related U.S. Application Data

(60) Provisional application No. 61/829,491, filed on May 31, 2013.

(30) Foreign Application Priority Data

Dec. 9, 2013 (TW) .............................. 102145065 A

(51) Int. Cl.
*G06F 11/14* (2006.01)
(52) U.S. Cl.
CPC .................................. *G06F 11/1402* (2013.01)
(58) Field of Classification Search
CPC .................................................. G06F 11/1402
See application file for complete search history.

(56) References Cited

U.S. PATENT DOCUMENTS

| 8,228,728 | B1* | 7/2012 | Yang | G11C 11/5628 365/185.03 |
|---|---|---|---|---|
| 2008/0055991 | A1* | 3/2008 | Kim | G11C 16/3454 365/185.11 |
| 2008/0162789 | A1* | 7/2008 | Choi | G11C 11/5628 711/103 |
| 2008/0172520 | A1* | 7/2008 | Lee | G11C 11/5628 711/103 |
| 2008/0172521 | A1* | 7/2008 | Lee | G11C 11/5628 711/103 |

(Continued)

*Primary Examiner* — Joseph D Torres
(74) *Attorney, Agent, or Firm* — McClure, Qualey & Rodack, LLP

(57) ABSTRACT

The present invention provides a data storage device including a flash memory and a controller. The flash memory is capable of operating in a SLC mode and a non-SLC mode. The controller is configured to perform a first read operation to read a page corresponding to a first word line of the flash memory in the SLC mode according to a read command of a host, and perform an adjustable read operation when data read by the first read operation cannot be recovered by coding, wherein the controller is further configured to enable the flash memory to operate in the non-SLC mode in the adjustable read operation, and write logic 1 into a most-significant-bit page corresponding to the first word line in the non-SLC mode to adjust voltage distribution of the first page.

28 Claims, 13 Drawing Sheets

(56) References Cited

U.S. PATENT DOCUMENTS

| | | | | |
|---|---|---|---|---|
| 2008/0209114 A1* | 8/2008 | Chow | G06F 12/0804 | 711/103 |
| 2009/0228739 A1* | 9/2009 | Cohen | G06F 11/1072 | 714/6.12 |
| 2009/0296478 A1* | 12/2009 | Kim | G11C 11/5628 | 365/185.18 |
| 2010/0172180 A1* | 7/2010 | Paley | G06F 12/0246 | 365/185.12 |
| 2010/0174846 A1* | 7/2010 | Paley | G06F 12/0246 | 711/103 |
| 2010/0174847 A1* | 7/2010 | Paley | G06F 12/0246 | 711/103 |
| 2010/0332922 A1* | 12/2010 | Chang | G11C 5/143 | 714/704 |
| 2011/0286267 A1* | 11/2011 | Rychlik | G11C 16/10 | 365/185.03 |
| 2012/0005415 A1* | 1/2012 | Jung | G06F 12/0246 | 711/103 |
| 2012/0014186 A1* | 1/2012 | Li | G11C 11/5628 | 365/185.25 |
| 2012/0079173 A1* | 3/2012 | Chae | G06F 12/0246 | 711/103 |
| 2012/0173827 A1* | 7/2012 | Wood | G11C 11/5621 | 711/154 |
| 2012/0240012 A1* | 9/2012 | Weathers | G06F 11/1072 | 714/773 |
| 2013/0024605 A1* | 1/2013 | Sharon | G06F 11/1072 | 711/103 |
| 2013/0031431 A1* | 1/2013 | Sharon | G06F 11/1072 | 714/719 |
| 2013/0080730 A1* | 3/2013 | Kim | G06F 12/0246 | 711/203 |
| 2013/0132644 A1* | 5/2013 | Choi | G06F 12/0246 | 711/103 |
| 2013/0322169 A1* | 12/2013 | Goss | G11C 16/22 | 365/185.02 |
| 2013/0339603 A1* | 12/2013 | Zhu | G06F 3/0614 | 711/114 |
| 2014/0281820 A1* | 9/2014 | Alrod | G11C 16/3459 | 714/773 |

* cited by examiner

| word line | page | word line | page |
|---|---|---|---|
| 0 | 0 | 21 | 21 |
| 1 | 1 | 22 | 22 |
| 2 | 2 | 23 | 23 |
| 3 | 3 | 24 | 24 |
| 4 | 4 | 25 | 25 |
| 5 | 5 | 26 | 26 |
| 6 | 6 | 27 | 27 |
| 7 | 7 | 28 | 28 |
| 8 | 8 | 29 | 29 |
| 9 | 9 | 30 | 30 |
| 10 | 10 | 31 | 31 |
| 11 | 11 | 32 | 32 |
| 12 | 12 | ⋮ | ⋮ |
| 13 | 13 | | |
| 14 | 14 | | |
| 15 | 15 | | |
| 16 | 16 | | |
| 17 | 17 | | |
| 18 | 18 | | |
| 19 | 19 | | |
| 20 | 20 | | |

FIG. 2

| word line | page | |
|---|---|---|
| | LSB | MSB |
| 0 | 0 | 2 |
| 1 | 1 | 4 |
| 2 | 3 | 6 |
| 3 | 5 | 8 |
| 4 | 7 | 10 |
| 5 | 9 | 12 |
| 6 | 11 | 14 |
| 7 | 13 | 16 |
| 8 | 15 | 18 |
| 9 | 17 | 20 |
| 10 | 19 | 22 |
| 11 | 21 | 24 |
| 12 | 23 | 26 |
| 13 | 25 | 28 |
| 14 | 27 | 30 |
| 15 | 29 | 32 |
| ⋮ | ⋮ | ⋮ |

FIG. 3

| word line | page | | |
|---|---|---|---|
| | LSB | CSB | MSB |
| 0 | 0 | 2 | 5 |
| 1 | 1 | 4 | 8 |
| 2 | 3 | 7 | 11 |
| 3 | 6 | 10 | 14 |
| 4 | 9 | 13 | 17 |
| 5 | 12 | 16 | 20 |
| 6 | 15 | 19 | 23 |
| 7 | 18 | 22 | 26 |
| 8 | 21 | 25 | 29 |
| 9 | 24 | 28 | 32 |
| ⋮ | ⋮ | ⋮ | ⋮ |

FIG. 4

DATA STORAGE DEVICE AND ERROR CORRECTION METHOD THEREOF

CROSS REFERENCE TO RELATED APPLICATIONS

This application claims the benefit of U.S. Provisional Application No. 61/829,491, filed May 31, 2013, the entirety of which is incorporated by reference herein. Furthermore, this Application claims priority of Taiwan Patent Application No. 102145065, filed on Dec. 9, 2013, the entirety of which is incorporated by reference herein.

BACKGROUND OF THE INVENTION

1. Field of the Invention

The present invention relates to an error correction method applied to a data storage device, and in particular to an error correction method capable of adjusting the voltage distribution of the data storage device.

2. Description of the Related Art

Flash memory is considered a non-volatile data storage device, using electrical methods to erase and program itself. Taking NAND Flash as an example, it is often used as a memory card, USB flash device, solid state device, eMMC, and other uses.

Flash memory such as NAND Flash uses a multiple-block structure to store data. Each block contains multiple pages. Due to the possibility of errors occurring during the flash memory data storage procedure, the system now encodes the original data then stores the encoded data into flash memory; when data is read, the encoded data is first extracted then decoded back into the original data. Even though the encoding and decoding procedure can decrease errors, this procedure is still limited in correcting parts of bit errors. When the number of errors exceeds a certain value, the flash memory controller realizes it is unable to decode the data effectively when proceeding with the decoding procedures.

BRIEF SUMMARY OF THE INVENTION

A detailed description is given in the following embodiments with reference to the accompanying drawings.

The present invention provides a data storage device including a flash memory and a controller. The flash memory is capable of operating in an SLC mode and a non-SLC mode. The controller is configured to perform a first read operation to read a page corresponding to a first word line of the flash memory in the SLC mode according to a read command of a host, and perform an adjustable read operation when data read by the first read operation cannot be recovered by coding, wherein the controller is further configured to enable the flash memory to operate in the non-SLC mode in the adjustable read operation, and write logic 1 into a most-significant-bit page corresponding to the first word line in the non-SLC mode to adjust voltage distribution of the first page.

The present invention further provides an error correction method applied to a data storage device, wherein the data storage device includes a flash memory capable of operating in a SLC mode and a non-SLC mode. The error correction method includes: performing a first read operation to read a page corresponding to a first word line of the flash memory in the SLC mode according to a read command of a host; determining whether data read by the first read operation can be recovered by coding; and performing an adjustable read operation when data read by the first read operation cannot be recovered by coding. The adjustable read operation includes: enabling the flash memory to operate in the non-SLC mode; and writing logic 1 into a most-significant-bit page corresponding to the first word line in the non-SLC mode to adjust voltage distribution of the first page.

The present invention also provides a data reading method, applied to a data storage device, wherein the data storage device comprises a flash memory capable of operating in a SLC mode and a multi-level cell mode, the. The data reading method includes: performing a first read operation to read a page corresponding to a first word line of the flash memory in the SLC mode according to a read command of a host to obtain a first data segment; enabling the flash memory to operate in the multi-level cell mode when the first data segment cannot be recovered by coding; and writing predetermined data into a most-significant-bit page corresponding to the first word line in the multi-level cell mode; enabling the flash memory to operate in the SLC mode; and reading the page corresponding to the first word line again to obtain a second data segment.

The present invention provides another data reading method applied to a data storage device, wherein the data storage device comprises a flash memory capable of operating in a SLC mode and a multi-level cell mode. The data reading method includes: performing a first read operation to read a page corresponding to a first word line of the flash memory in the SLC mode according to a read command of a host to obtain a first data segment; writing a predetermined data into a most-significant-bit page corresponding to the first word line in the multi-level cell mode when the first data segment cannot be recovered by coding; enabling the flash memory to operate in the multi-level cell mode when the first data segment cannot be recovered by coding; writing a predetermined data into a most-significant-bit page corresponding to the first word line in the multi-level cell mode; and reading the page corresponding to the first word line in the SLC mode again to obtain a second data segment; and transmitting the second data segment to the host when the second data segment can be recovered by coding.

BRIEF DESCRIPTION OF THE DRAWINGS

The present invention can be more fully understood by reading the subsequent detailed description and examples with references made to the accompanying drawings, wherein:

FIG. 2 is a schematic diagram illustrating an embodiment of a mapping table of pages and word lines in the SLC mode of the present invention.

FIG. 3 is a schematic diagram illustrating an embodiment of a mapping table of pages and word lines in the MLC mode of the present invention.

FIG. 4 is a schematic diagram illustrating an embodiment of a mapping table of pages and word lines in the TLC mode of the present invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
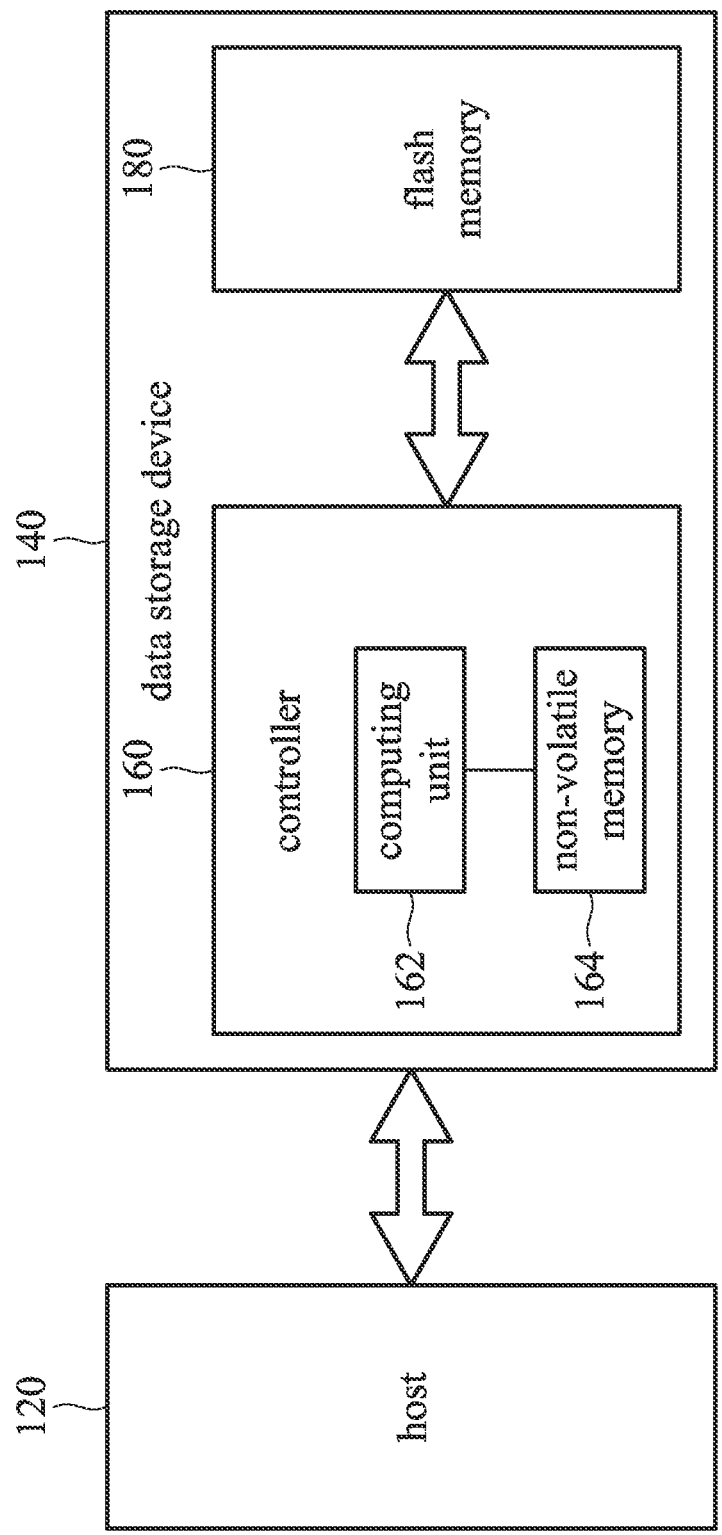
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data storage device 140. The data storage device 140 includes a flash memory 180 and a controller 160, wherein the data storage device 140 is capable of operating in response to commands of the host 110. The controller 160 includes a computing unit 162 and a nonvolatile memory 164, such as a read only memory (ROM). The program code and data stored in the nonvolatile memory 164 may be constituted to be a firmware, and performed by the computing unit 162, such that the controller 160 may control the flash memory 180 by the firmware. The flash memory 180 includes a plurality of pages, a plurality of word lines and plurality of bit lines, wherein each of the word lines is arranged to connect at least one page for selecting the target page. It should be noted that the flash memory 180 of the present invention is capable of operating in different access mode, such as SLC mode (Single-Level Cell mode) and non-SLC mode (non-Single-Level Cell mode), wherein the non-SLC mode (or multi-level-cell mode) includes MLC mode (Multi-Level Cell mode) and TLC mode (Triple-Level Cell mode).

For example, when the flash memory 180 operates in the SLC mode, each one of the memory cells of the flash memory 180 is configured to store only one bit of information, and each of the word lines of the flash memory 180 is configured to control only one page, wherein the mapping relationship of the word lines and the pages can be referred to in FIG. 2. FIG. 2 is a schematic diagram illustrating an embodiment of a mapping table of pages and word lines in the SLC mode of the present invention. As shown in FIG. 2, each of the word lines of the flash memory 180 corresponds to one page (is coupled to one page). Namely, in the SLC mode, a word line corresponds to a page. Moreover, the voltage distribution of the cells of the flash memory 180 requires two levels to store 1 bit information in the SLC mode, wherein the two levels correspond to logic "0" and "1", respectively.

When the flash memory 180 operates in the MLC mode, each one of the memory cells of the flash memory 180 is configured to store 2 bits of information, and each of the word lines of the flash memory 180 is configured to control two pages, wherein the mapping relationship of the word lines and the pages can be referred to in FIG. 3. FIG. 3 is a schematic diagram illustrating an embodiment of a mapping table of pages and word lines in the MLC mode of the present invention. As shown in FIG. 3, each of the word lines of the flash memory 180 corresponds to two pages (is coupled to two pages). Namely, in the MLC mode, a word line corresponds to two pages. Moreover, the voltage distribution of the cells of the flash memory 180 requires four levels to store 2 bits information in the MLC mode, wherein the four levels correspond to logic "00". "01", "10" and "11", respectively, and the four levels are separated from the two levels of the SLC mode.

When the flash memory 180 operates in the TLC mode, each one of the memory cells of the flash memory 180 is configured to store 3 bits of information, and each of the word lines of the flash memory 180 is configured to control three pages, wherein the mapping relationship of the word lines and the pages can be referred to in FIG. 4. FIG. 4 is a schematic diagram illustrating an embodiment of a mapping table of pages and word lines in the TLC mode of the present invention. As shown in FIG. 4, each of the word lines of the flash memory 180 corresponds to three pages (is coupled to three pages). Namely, in the TLC mode, a word line corresponds to three pages. Moreover, the voltage distribution of the cells of the flash memory 180 requires eight levels to store 3 bits of information in the TLC mode, wherein the eight levels correspond to logic "000", "001", "010", "011", "100", "101", "110" and "111", respectively, and the right levels are separated from the four levels of the MLC mode.

The firmware is built for providing the host 120 with an error correction method to recover the data that cannot be successfully read by an ordinary read operation of the flash memory 180. For example, when the data of the flash memory 180 which is read by the controller 160 is not successfully read and cannot be recovered by error-correcting code (ECC), the controller 160 may correct the data by the error correction method of the present invention. The error correction method of the present invention includes an adjustable read operation, but it is not limited thereto. In another embodiment of the present invention, the error correction method includes an adjustable read operation and a read retry procedure. The adjustable read operation of present invention is capable of adjusting the voltage distribution of the memory cell corresponding to the selected word line by switching the access modes of the flash memory 180.

For example, in one of the present embodiments, the controller 160 switches the access mode into the MLC mode from the SLC mode, and writes logic 1 (such as 0xFF) into the most-significant-bit page controlled by a first word line in the MLC mode to adjust the voltage distribution of the page controlled by the first word line in the SLC cell. Namely, the controller 160 switches the access mode into the MLC mode from the SLC mode, and moves the levels "00" and "01" to the levels "11" and "10" of the voltage distribution, respectively, to adjust the voltage distribution of the page controlled by the first word line in the SLC mode.

In another embodiment of the present invention, the controller 160 switches the access mode into the TLC mode from the SLC mode, and writes logic 1 (such as 0xFF) into the most-significant-bit page and the central-significant-bit page controlled by a first word line in the TLC mode to adjust the voltage distribution of the page controlled by the first word line in the SLC cell. Namely, the controller 160 switches the access mode into the TLC mode from the SLC mode, and move the levels "000", "001", "010", "011", "100" and "101" to the levels "11" and "10" of the voltage distribution, respectively, to adjust the voltage distribution of the page controlled by the first word line in the SLC mode.

Moreover, the read retry procedure of the present invention is arranged to reset the read voltage of the target page which cannot successfully be read by the controller 160 according to a read retry table, and retry to read the target page with the different read voltages. It should be noted that the target page is the page that the read command of the host 120 is required to read.

In one embodiment, the controller 160 is configured to perform a first read operation to read a page corresponding to a first word line of the flash memory 180 in the SLC mode according to a read command received from the host 120. Namely, the controller 160 is configured to perform a first read operation to read the page controlled by the first word line of the flash memory 180 in response to the read command of the host 120. When data read by the first read operation cannot be recovered by coding, the controller 160 performs the adjustable read operation. In the adjustable read operation, the controller 160 enables the flash memory 180 to operate in the MLC mode, and writes a logic "1" (such as, 0xFF) into the most-significant-bit page corresponding to the first word line in the MLC mode to adjust voltage distribution of the first page. Next, the controller 160 is further configured to enable the flash memory 180 to operate in the SLC mode again, and perform a second read operation to read the page corresponding to the first word line again after the logic "1" has been written into the most-significant-bit page corresponding to the first word line. When the controller 160 successfully reads the data of the page corresponding to the first word line by the second read operation, the controller 160 transmits the data read by the second read operation to the host 120. Namely, when the data read by the second read operation does not have an error or the error of the data read by the second read operation can be corrected by coding, the controller 160 transmits the data read by the second read operation to the host 120. When the controller 160 cannot successfully read the data of the page corresponding to the first word line by the second read operation, the controller 160 marks the page corresponding to the first word line as a bad page. Namely, when the data read by the second read operation cannot be corrected by coding, the controller 160 marks the page corresponding to the first word line as a bad page.

In another embodiment of the present invention, in the adjustable read operation, the controller 160 enables the flash memory 180 to operate in the TLC mode and writes logic "1" (such as, 0xFF) into the most-significant-bit page and the central-significant-bit page corresponding to the first word line in the TLC mode to adjust voltage distribution of the first page. Next, the controller 160 is further configured to enable the flash memory 180 to operate in the SLC mode and perform a second read operation to read the page corresponding to the first word line again in the SLC mode after writing logic "1" (such as, 0xFF) into the most-significant-bit page and the central-significant-bit page. When the controller 160 successfully reads the data of the page corresponding to the first word line by the second read operation, the controller 160 transmits the data read by the second read operation to the host 120. Namely, when the data read by the second read operation does not have an error or the error of the data read by the second read operation can be corrected by coding, the controller 160 transmits the data read by the second read operation to the host 120. When the controller 160 cannot successfully read the data of the page corresponding to the first word line by the second read operation, the controller 160 marks the page corresponding to the first word line as a bad page. Namely, when the data read by the second read operation cannot be corrected by coding, the controller 160 marks the page corresponding to the first word line as a bad page.

In another embodiment, the controller 160 is further configured to perform a read retry procedure before the adjustable read operation when data read by the first read operation cannot be recovered by coding. In the read retry procedure, the controller 160 is configured to set voltage value on a register according to a read retry table and have the voltage value of the register serve as read voltage of the flash memory 180. Next, the controller 160 is further configured to perform a second read operation to read the page corresponding to the first word line by the read voltage corresponding to the voltage value on the register and increase a read retry count by 1 in the read retry procedure.

When the controller 160 successfully reads the data of the page corresponding to the first word line by the second read operation, the controller 160 transmits the data read by the second read operation to the host 120. When the controller 160 cannot successfully read the data of the page corresponding to the first word line by the second read operation, the controller 160 repeats the read retry procedure until the controller 160 successfully reads the data of the page corresponding to the first word line or the read retry procedure is performed a first predetermined number of times. When the read retry procedure is performed a first predetermined number of times, the controller 160 is configured to perform the adjustable read operation. For example, the first predetermined number of times may be 1, 5, 10, 20, 30, 50, 100 or 500 times, but it is not limited thereto. The first predetermined number of times may be determined according to the experimental data of the success rate of the read retry procedure.

Figure 5:
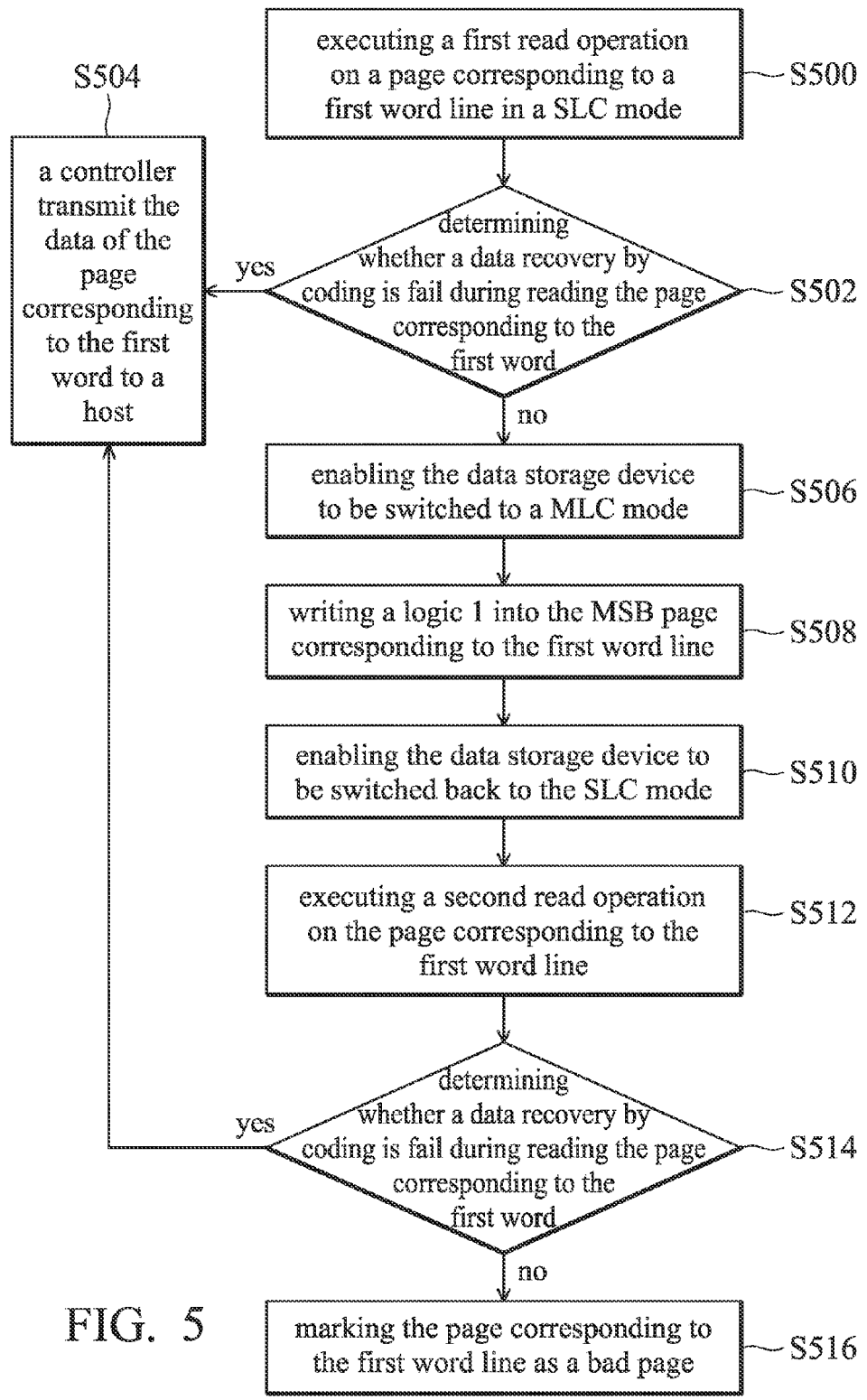
FIG. 5 is a flowchart of an error correction method according to an embodiment of the present invention.

FIG. 5 is a flowchart of an error correction method according to an embodiment of the present invention. The error correction method is applied to the data storage device 140 of FIG. 1. The process starts at step S500.

In step S500, the controller 160 is configured to perform a first read operation to read a page corresponding to a first word line of the flash memory 180 in the SLC mode according to a read command received from the host 120. Namely, the controller 160 is configured to perform a first read operation to read the page controlled by the first word line of the flash memory 180 in response to the read command of the host 120.

Next, in step S502, the controller 160 is configured to determine whether data read by the first read operation can be recovered by coding. When data read by the first read operation can be recovered by coding, the process goes to step S504, otherwise, the process goes to step S506.

In step S504, the controller 160 transmits the data r to the host 120. The process ends at step S504.

In step S506, the controller 160 enables the flash memory 180 to operate in the MLC mode.

Next, in step S508, the controller 160 writes a logic "1" (such as, 0xFF) into the most-significant-bit page corresponding to the first word line in the MLC mode to adjust voltage distribution of the first page.

Next, in step S510, the controller 160 enables the flash memory 180 to operate in the SLC mode again.

Next, in step S512, the controller 160 performs a second read operation to read the page corresponding to the first word line in the SLC mode again.

Next, in step S514, the controller 160 determines whether data read by the second read operation can be recovered by coding. When the data read by the second read operation can be recovered by coding, the process goes to step S504, otherwise, the process goes to step S516.

In step S516, the controller 160 marks the page corresponding to the first word line as a bad page. The process ends at step S516.

Figure 6A:
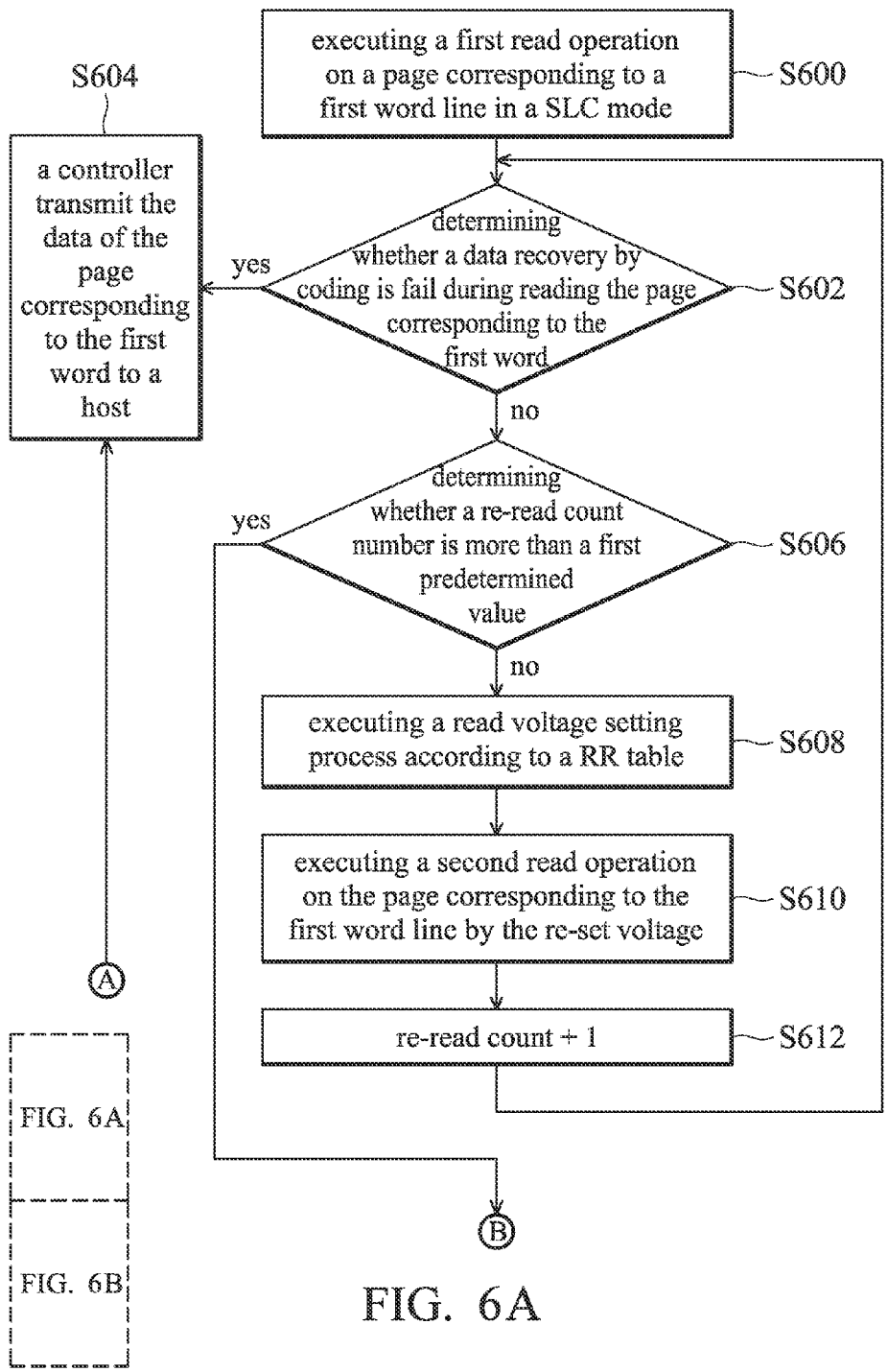
FIGS. 6A-6B are a flowchart of an error correction method according to another embodiment of the present invention.
Figure 6B:
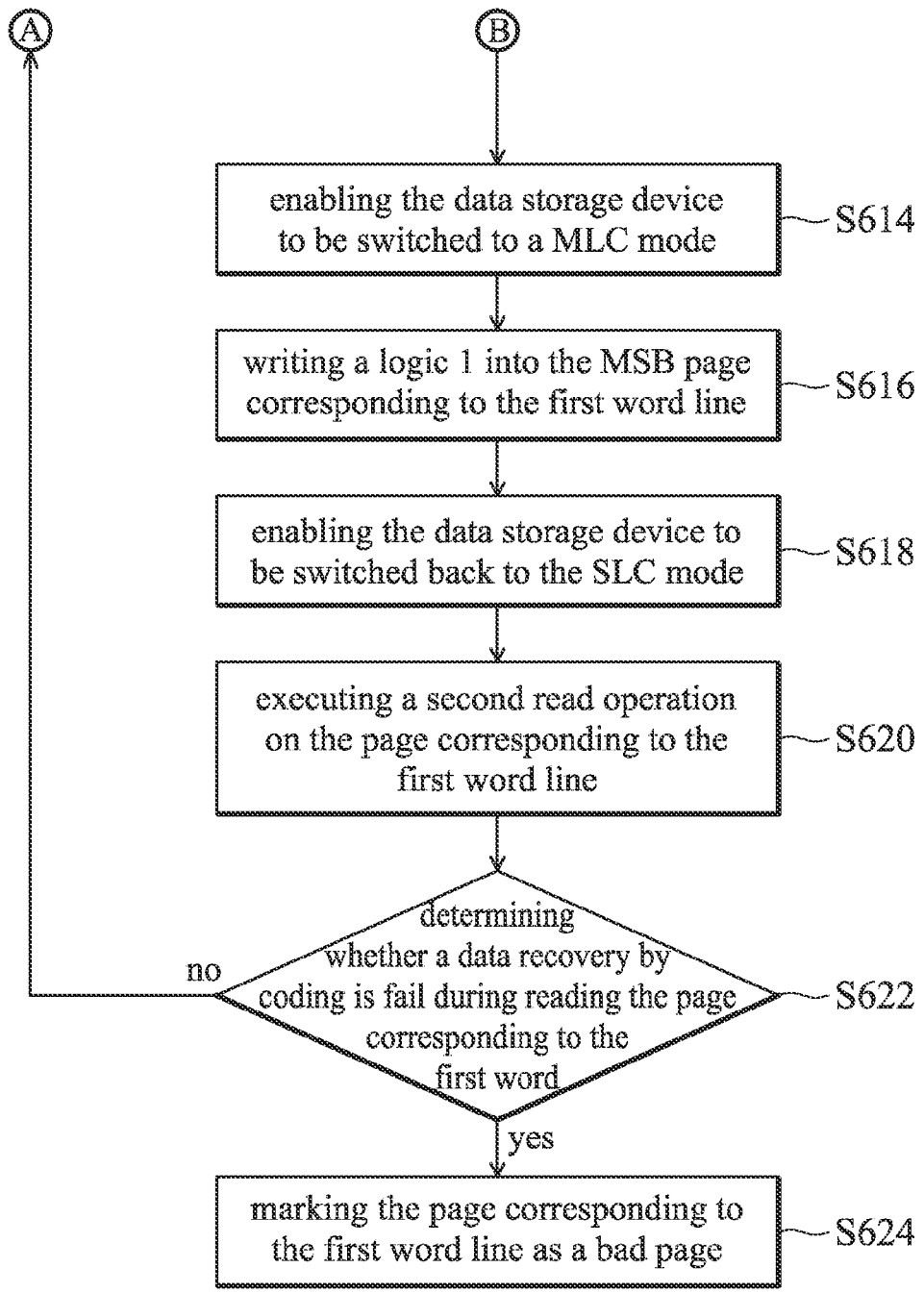

FIGS. 6A-6B are a flowchart of an error correction method according to another embodiment of the present invention. The error correction method is applied to the data storage device 140 of FIG. 1. The process starts at step S600. It should be noted that steps S600-S604 are similar to steps S500-S504. The details of steps S600-S604 can be referred to in step steps S500-S504.

In step S606, the controller 160 determines whether a read retry count is higher than a first predetermined number. For example, the controller 160 may use a memory block or a register of the flash memory 180 or other memory devices to record the read retry count corresponding to the number of times the read retry procedure has been performed. When the read retry count is higher than the first predetermined number, the process goes to step S614, otherwise, the process goes to step S608.

In step S608, the controller 160 is configured to set voltage value on a register according to a read retry table and have the voltage value of the register serve as read voltage of the flash memory 180. For example, the read retry table can be stored in the nonvolatile memory 164.

Next, in step S610, the controller 160 is further configured to perform a second read operation to read the page corresponding to the first word line by the read voltage corresponding to the voltage value on the register.

Next, in step S612, the controller 160 increases the read retry count by 1. For example, the controller 160 is configured to increase the value of a memory block or a register arranged to store the read retry count by one. Next, the process returns to step S602.

In step S614, the controller 160 enables the data storage device 140 to operate in the MLC mode.

Next, in step S616, the controller 160 writes logic 1 (such as 0xFF) into the most-significant-bit page controlled by a first word line in the MLC mode to adjust the voltage distribution of the page controlled by the first word line in the SLC mode.

Next, in step S618, the controller 160 enables the flash memory 180 to operate in the SLC mode again.

Next, in step S620, the controller 160 performs a second read operation to read the page corresponding to the first word line in the SLC mode again.

Next, in step S622, the controller 160 determines whether data read by the second read operation can be recovered by coding. When the data read by the second read operation can be recovered by coding, the process goes to step S604, otherwise, the process goes to step S626.

In step S624, the controller 160 marks the page corresponding to the first word line as a bad page. The process ends at step S624.

Figure 7:
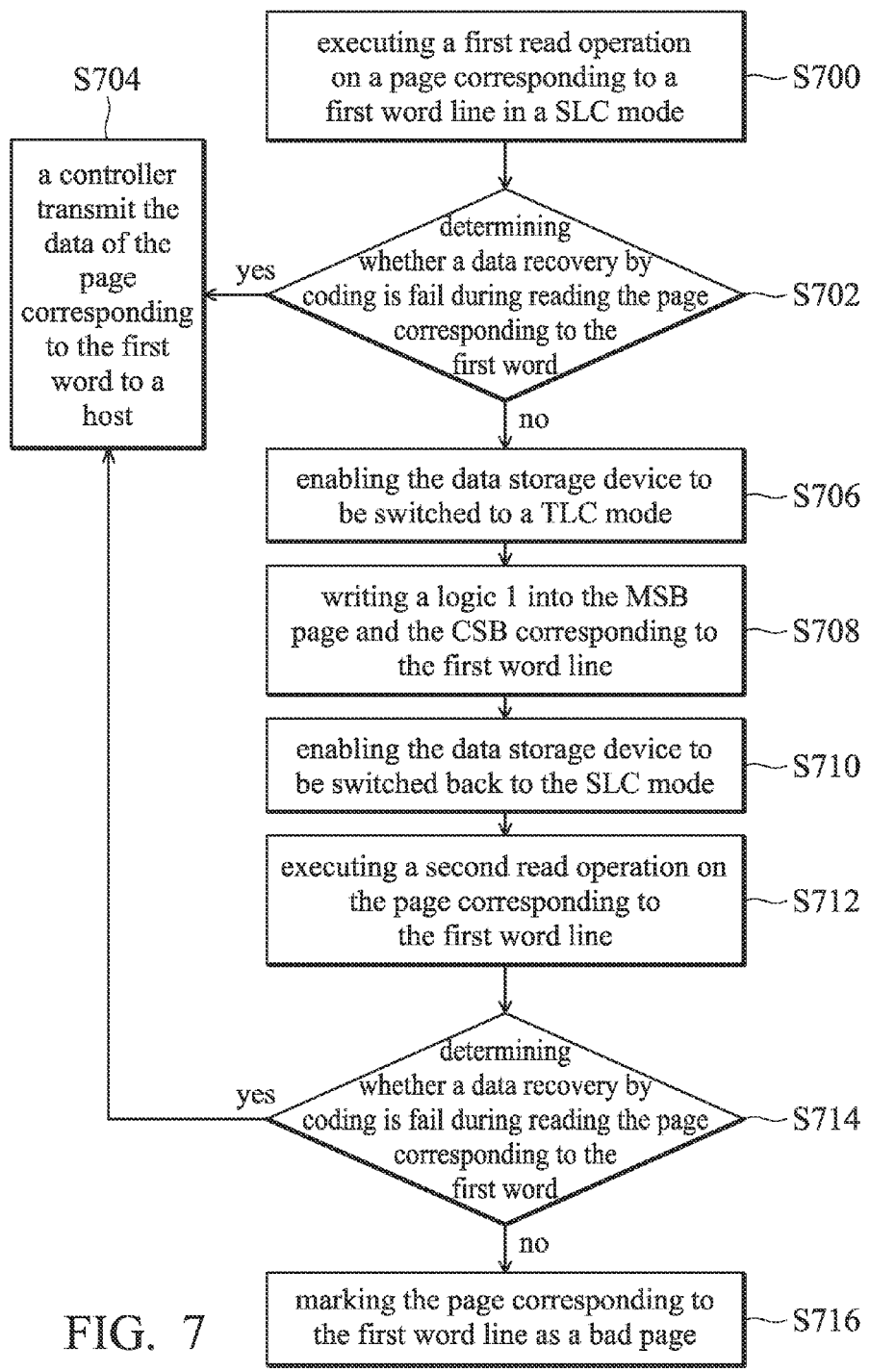
FIG. 7 is a flowchart of an error correction method according to another embodiment of the present invention.

FIG. 7 is a flowchart of an error correction method according to another embodiment of the present invention. The error correction method is applied to the data storage device 140 of FIG. 1. The process starts at step S700. It should be noted that steps S700-S704 and S710-S716 are similar to steps S500-S504 and S510-S516. The details of steps S700-S704 and S710-S716 can be referred to in step steps S500-S504 and S510-S516.

In step S706, the controller 160 enables the data storage device 140 to operate in the TLC mode.

Next, in step S708, the controller 160 writes logic "1" (such as, 0xFF) into the most-significant-bit page and the central-significant-bit page corresponding to the first word line in the TLC mode to adjust voltage distribution of the first page.

Figure 8A:
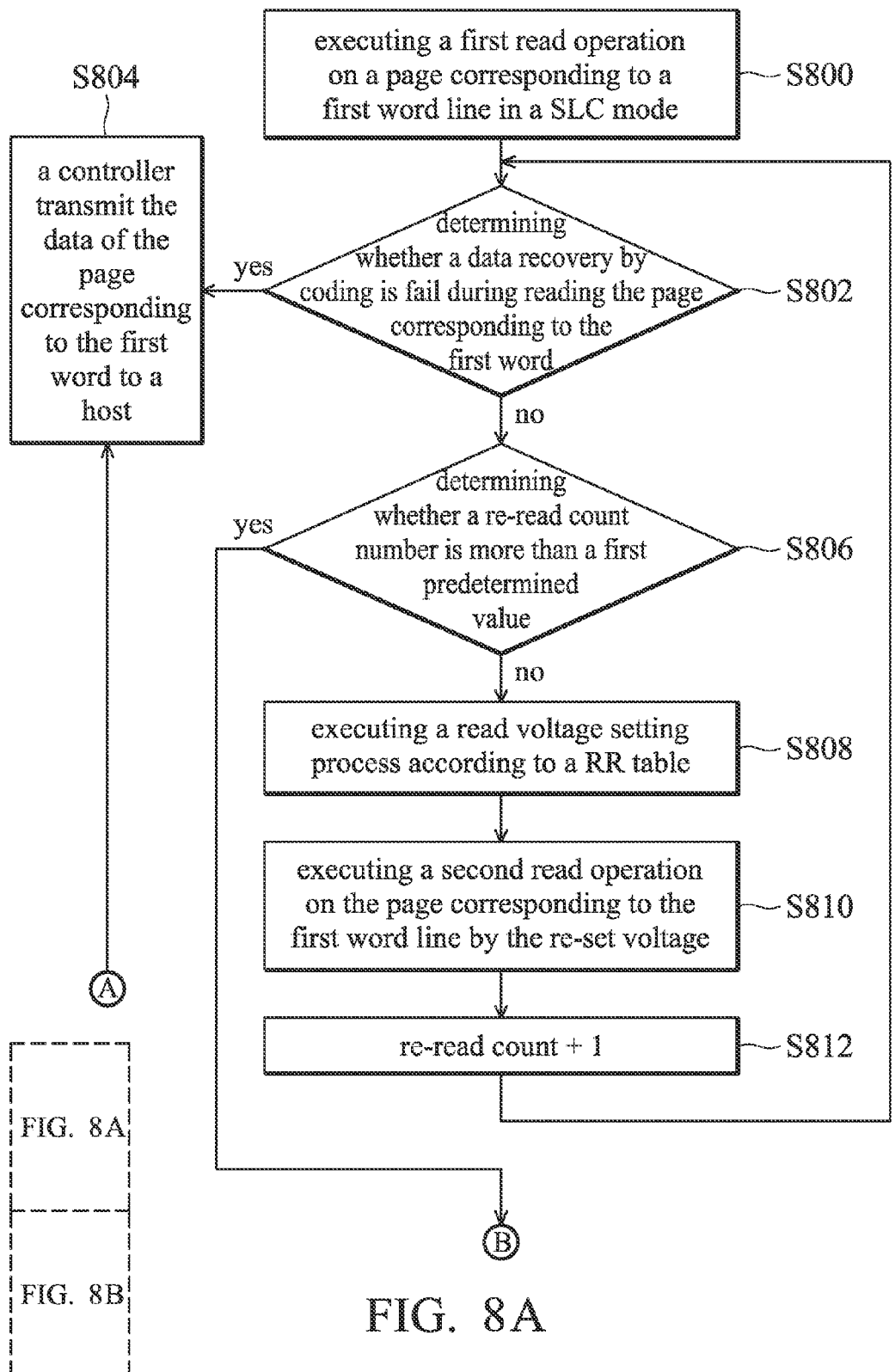
FIGS. 8A-8B are a flowchart of an error correction method according to another embodiment of the present invention.
Figure 8B:
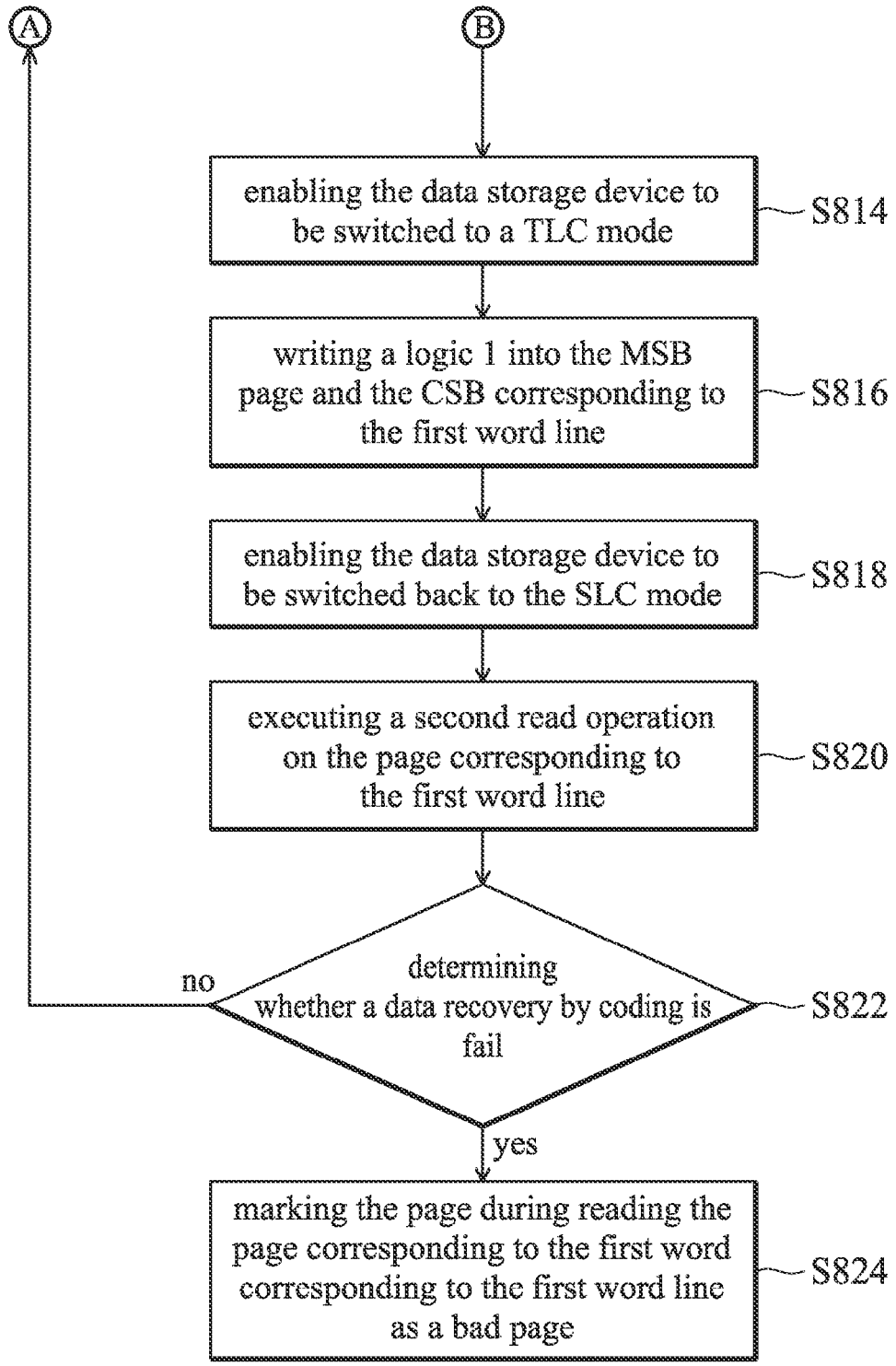

FIGS. 8A-8B are a flowchart of an error correction method according to another embodiment of the present invention. The error correction method is applied to the data storage device 140 of FIG. 1. The process starts at step S800. It should be noted that steps S800-S812 and S818-S824 are similar to the steps S600-S612 and S618-S624. The details of steps S800-S812 and S818-S824 can be referred to in steps S600-S612 and S618-S624.

In step S814, the controller 160 enables the flash memory 180 to operate in the TLC mode.

Next, in step S816, the controller 160 writes logic "1" (such as, 0xFF) into the most-significant-bit page and the central-significant-bit page corresponding to the first word line in the TLC mode to adjust voltage distribution of the first page.

Figure 9:
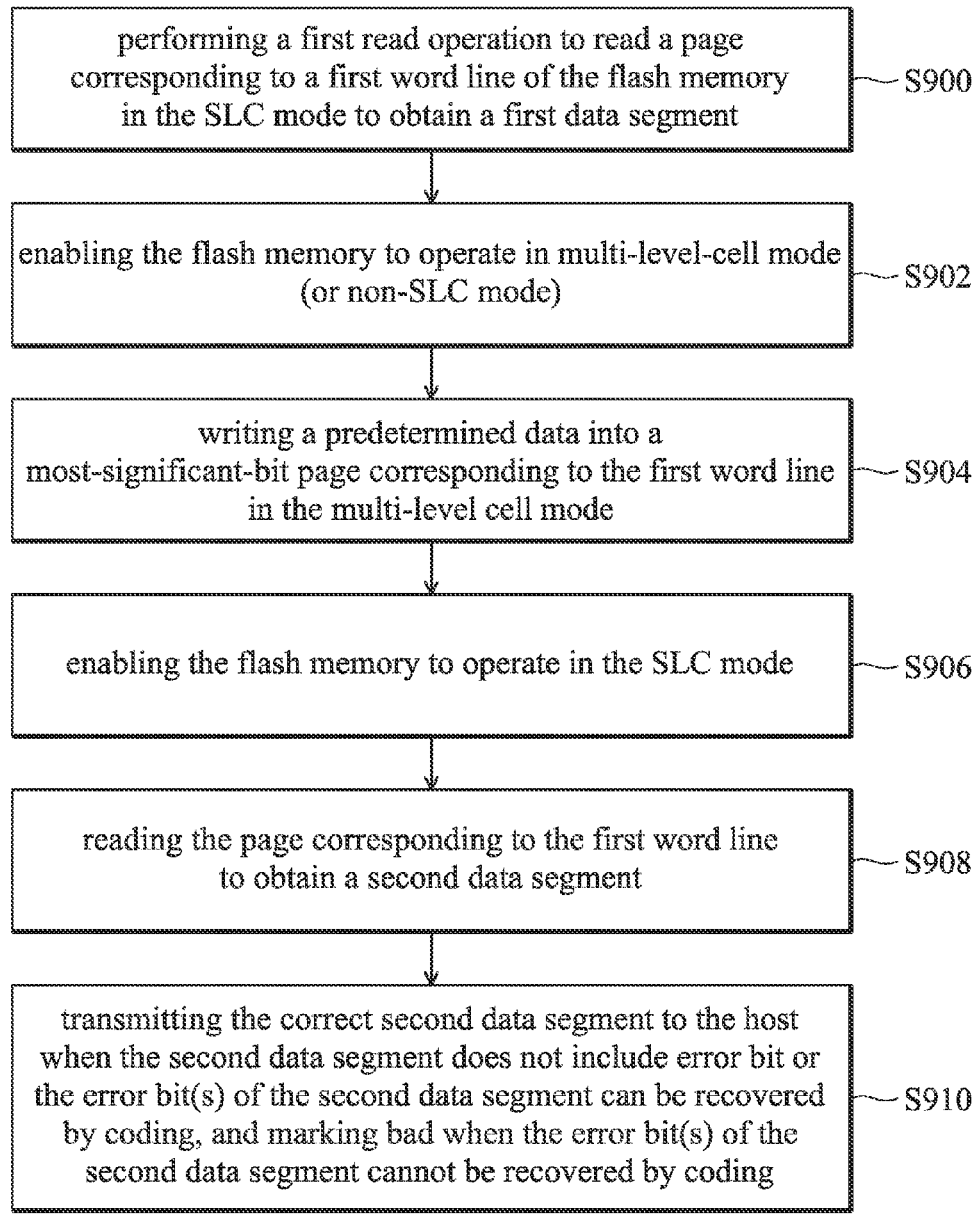
FIG. 9 is a flowchart of a data reading method according to an embodiment of the present invention.

FIG. 9 is a flowchart of a data reading method according to an embodiment of the present invention. The data reading method is applied to the data storage device 140 of FIG. 1. The process starts at step S900.

In step S900, the controller 160 performs a first read operation to read a page corresponding to a first word line of the flash memory in the SLC mode according to a read command of a host 120 to obtain a first data segment. Namely, the controller 160 is configured to perform the first read operation to read the page controlled by the first word line of the flash memory 180 in response to the read command of the host 120 to obtain the first data segment.

The first data segment read by the first read operation may include some error bit(s) or not, and the error bit(s) of the first data segment may be corrected by ECC code. When the first data segment does not include error bit(s) or the error bit(s) of the first data segment can be recovered by coding, the controller 160 transmits the correct first data segment to the host 120. When the error bit(s) of the first data segment cannot be recovered by coding, the process goes to step S902. In the step S902, the controller 160 enables the flash memory 180 to operate in multi-level-cell mode (or non-SLC mode).

Next, in step S904, the controller 160 writes predetermined data into a most-significant-bit page corresponding to the first word line in the multi-level cell mode. In one embodiment, the predetermined data is "0Xff", but it is not limited thereto.

Next, in step S906, the controller 160 enables the flash memory 180 to operate in the SLC mode.

Next, in step S908, the controller 160 reads the page corresponding to the first word line in SLC mode again to obtain a second data segment.

The second data segment read may include some error bit(s) or not, and the error bit(s) of the second data segment may be correct by ECC code. In step 910, the controller 160 transmits the correct second data segment to the host 120 when the second data segment does not include error bit(s) or the error bit(s) of the second data segment can be recovered by coding, and the controller 160 marks the page corresponding to the first word line as a bad page or a first block corresponding to the first word line as a bad block when the error bit(s) of the second data segment cannot be recovered by coding. The process ends at step 910.

Figure 10:
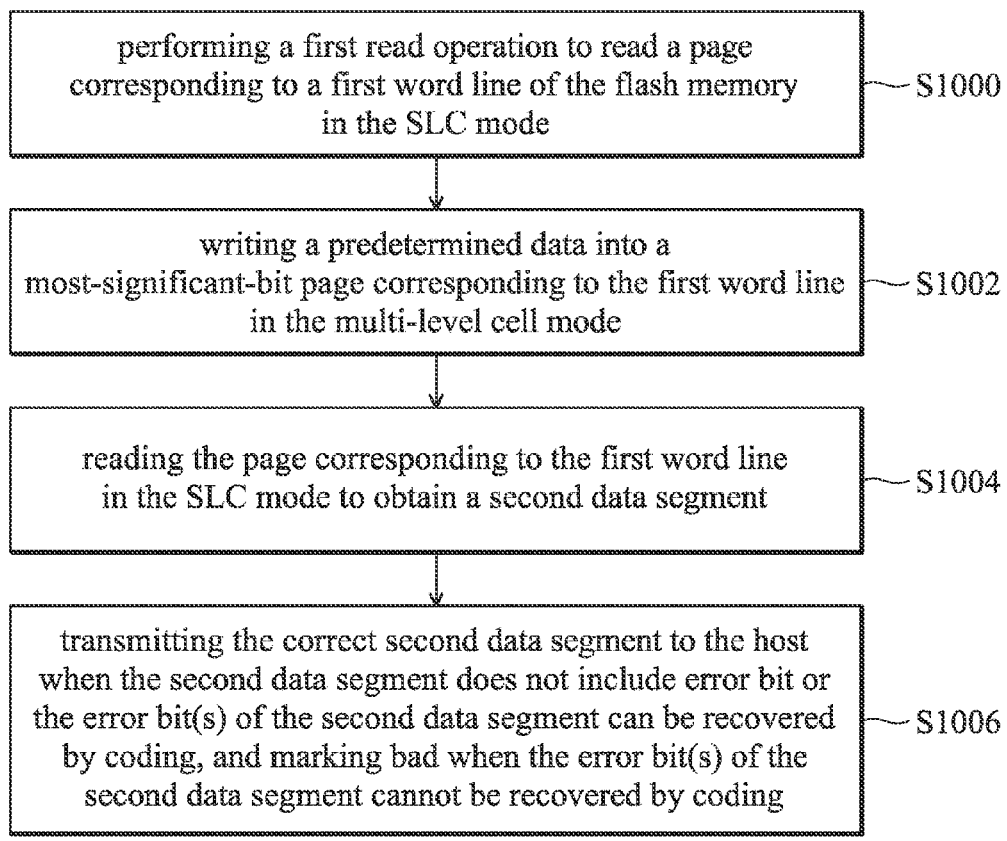
FIG. 10 is a flowchart of a data reading method according to another embodiment of the present invention.

FIG. 10 is a flowchart of a data reading method according to another embodiment of the present invention. The data reading method is applied to the data storage device 140 of FIG. 1. The process starts at step S1000.

In step S1000, the controller 160 performs a first read operation to read a page corresponding to a first word line of the flash memory in the SLC mode according to a read command of a host 120 to obtain a first data segment. Namely, the controller 160 is configured to perform the first read operation to read the page controlled by the first word line of the flash memory 180 in response to the read command of the host 120 to obtain the first data segment.

The first data segment read by the first read operation may include some error bit(s) or not, and the error bit(s) of the first data segment may be correct by ECC code. When the first data segment does not include error bit or the error bit(s) of the first data segment can be recovered by coding, the controller 160 transmits the correct first data segment to the host 120. When the error bit(s) of the first data segment cannot be recovered by coding, the process goes to step S902. In the step S1002, the controller 160 writes a predetermined data into a most-significant-bit page corresponding to the first word line in the multi-level cell mode. In one embodiment, the predetermined data is "0Xff", but it is not limited thereto.

Next, in step S1004, the controller 160 reads the page corresponding to the first word line in SLC mode again to obtain a second data segment.

Next, in step S1006, the controller 160 transmits the correct second data segment to the host 120 when the second data segment does not include error bit or the error bit(s) of the second data segment can be recovered by coding, and the controller 160 marks the page corresponding to the first word line as a bad page or a first block corresponding to the first word line as a bad block when the error bit(s) of the second data segment cannot be recovered by coding. The process ends at step 1006.

Figure 11:
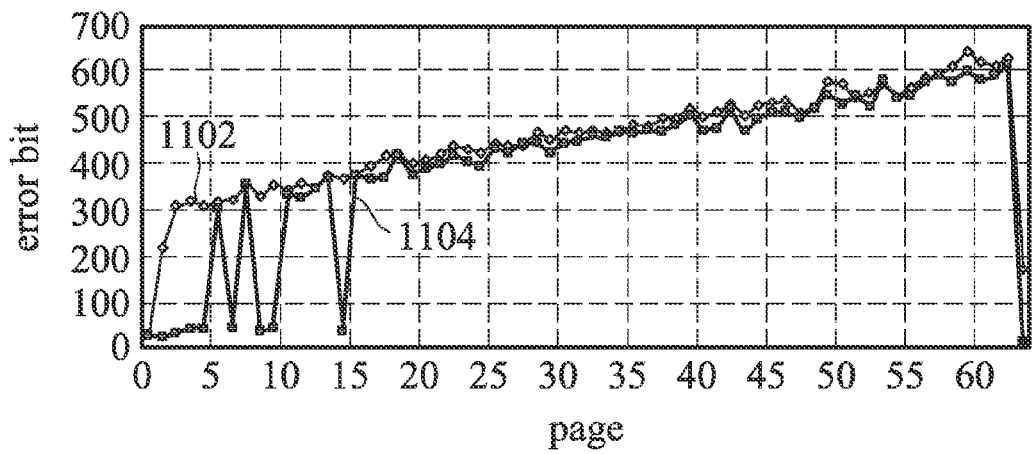
FIG. 11 is an error bit simulation diagram.

FIG. 11 is an error bit simulation diagram based on the simulation without the error correction method of the present invention. In this simulation diagram, the line 1102 represents the error bits, and the line 1104 represents the error bits after performing the read retry procedure. As shown in FIG. 11, the read retry procedure can reduce limited error bits, but the number of error bits is still too high to be corrected.

Figure 12:
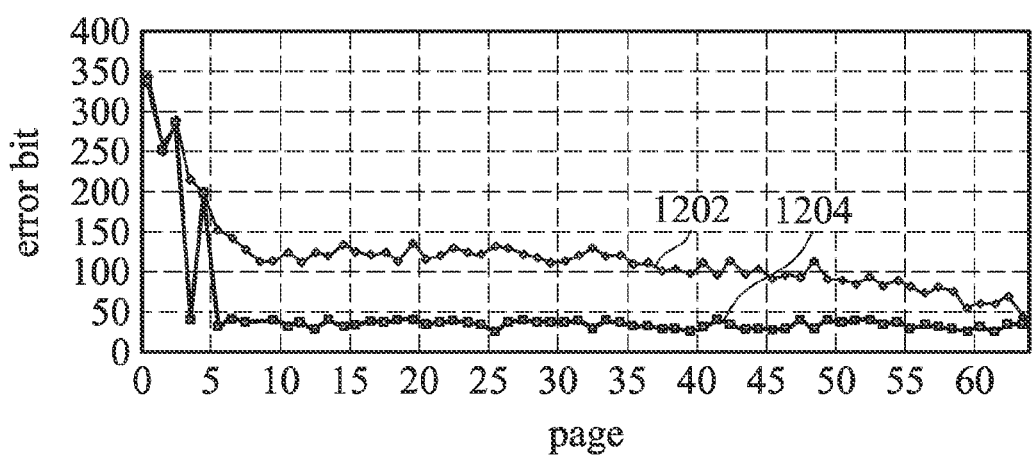
FIG. 12 is an error bit simulation diagram of the present invention.

FIG. 12 is an error bit simulation diagram of the present invention which shows the error bit result of the error correction method of the present invention. In this simulation diagram, the line 1202 represents the error bits after performing the adjustable read operation, and line 1204 represents the error bits after performing the adjustable read operation and the read retry procedure. As shown in FIG. 12, the adjustable read operation can significantly reduce the error bits, and performing both of the adjustable read operation and the read retry procedure can reduce more error bits than only performing the adjustable read operation.

The data storage device 140 and the error correction method can adjust the voltage distribution by the adjustable read operation in the non-SLC mode. Moreover, the read retry procedure can repeat the read retry procedure to read the target page by different read voltage.

Data transmission methods, or certain aspects or portions thereof, may take the form of a program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, capable of operating in a SLC mode and a non-SLC mode; and
a controller, configured to perform a first read operation to read a page corresponding to a first word line of the flash memory in the SLC mode according to a read command of a host, and perform an adjustable read operation when data read by the first read operation cannot be recovered by coding, wherein the controller is further configured to enable the flash memory to operate in the non-SLC mode in the adjustable read operation, and write logic 1 into a most-significant-bit page corresponding to the first word line in the non-SLC mode to adjust voltage distribution of the first page.

2. The data storage device as claimed in claim 1, wherein the non-SLC mode is a MLC mode.

3. The data storage device as claimed in claim 2, wherein the controller is further configured to enable the flash memory to operate in the SLC mode and perform a second read operation to read the page corresponding to the first word line in the SLC mode again after writing the logic 1 into the most-significant-bit page during the adjustable read operation.

4. The data storage device as claimed in claim 3, wherein the controller is further configured to mark the page corresponding to the first word line as a bad page when data read by the second read operation cannot be recovered by coding.

5. The data storage device as claimed in claim 1, wherein the non-SLC mode is a TLC mode.

6. The data storage device as claimed in claim 5, wherein the controller is further configured to write a logic 1 into a central-significant-bit page corresponding to the first word line in the TLC mode during the adjustable read operation to adjust voltage distribution of the memory cell corresponding to the first word line.

7. The data storage device as claimed in claim 6, wherein the controller is further configured to enable the flash memory to operate in the SLC mode and perform a second read operation to read the page corresponding to the first word line in the SLC mode again after writing the logic 1 into the most-significant-bit page and the central-significant-bit page during the adjustable read operation.

8. The data storage device as claimed in claim 7, wherein the controller is further configured to mark the page corresponding to the first word line as a bad page when data read by the second read operation cannot be recovered by coding.

9. The data storage device as claimed in claim 5, wherein the controller is further configured to perform a second read operation to read the page corresponding to the first word line by the read voltage corresponding to the voltage value on the register and increase a read retry count by 1 in the read retry procedure.

10. The data storage device as claimed in claim 9, wherein the controller is further configured to determine whether the read retry count is higher than a first predetermined number in the read retry procedure and perform the adjustable read operation when the read retry count is higher than the first predetermined number.

11. The data storage device as claimed in claim 1, wherein the controller is further configured to perform a read retry procedure before the adjustable read operation when data read by the first read operation cannot be recovered by coding, wherein the controller is configured to set voltage value on a register according to a read retry table and have the voltage value of the register serve as read voltage of the flash memory in the read retry procedure.

12. A error correction method, applied to a data storage device, wherein the data storage device comprises a flash memory capable of operating in a SLC mode and a non-SLC mode, the error correction method comprising:
performing a first read operation to read a page corresponding to a first word line of the flash memory in the SLC mode according to a read command of a host;

determining whether data read by the first read operation can be recovered by coding; and performing an adjustable read operation when data read by the first read operation cannot be recovered by coding, wherein the adjustable read operation comprises:

enabling the flash memory to operate in the non-SLC mode; and writing logic 1 into a most-significant-bit page corresponding to the first word line in the non-SLC mode to adjust voltage distribution of the first page.

13. The error correction method as claimed in claim 12, wherein the non-SLC mode is a MLC mode.

14. The error correction method as claimed in claim 13, wherein the step of the adjustable read operation further comprises:

enabling the flash memory to operate in the SLC mode after writing the logic 1 into the most-significant-bit page; and performing a second read operation to read the page corresponding to the first word line in the SLC mode again.

15. The error correction method as claimed in claim 14, wherein the step of the adjustable read operation further comprises marking the page corresponding to the first word line as a bad page when data read by the second read operation cannot be recovered by coding.

16. The error correction method as claimed in claim 12, wherein the non-SLC mode is a TLC mode.

17. The error correction method as claimed in claim 16, wherein the step of the adjustable read operation further comprises writing a logic 1 into a central-significant-bit page corresponding to the first word line in the TLC mode to adjust voltage distribution of memory cell corresponding to the first word line.

18. The error correction method as claimed in claim 17, wherein the step of the adjustable read operation further comprises:

enabling the flash memory to operate in the SLC mode after writing the logic 1 into the most-significant-bit page and the central-significant-bit page; and performing a second read operation to read the page corresponding to the first word line in the SLC mode again.

19. The error correction method as claimed in claim 18, wherein the step of the adjustable read operation further comprises marking the page corresponding to the first word line as a bad page when data read by the second read operation cannot be recovered by coding.

20. The error correction method as claimed in claim 12, further comprising performing a read retry procedure before the adjustable read operation when data read by the first read operation cannot be recovered by coding, wherein the read retry procedure comprises setting voltage value on a register according to a read retry table and having the voltage value of the register serve as read voltage of the flash memory.

21. The error correction method as claimed in claim 20, wherein the step of the read retry procedure further comprises performing a second read operation to read the page corresponding to the first word line by the read voltage corresponding to the voltage value on the register and increasing a read retry count by 1.

22. The error correction method as claimed in claim 21, wherein the step of the read retry procedure further comprises:

determining whether the read retry count is higher than a first predetermined number in the read retry procedure; and performing the adjustable read operation when the read retry count is higher than the first predetermined number.

23. A data reading method, applied to a data storage device, wherein the data storage device comprises a flash memory capable of operating in a SLC mode and a multi-level cell mode, the data reading method comprising:

performing a first read operation to read a page corresponding to a first word line of the flash memory in the SLC mode according to a read command of a host to obtain a first data segment;

enabling the flash memory to operate in the multi-level cell mode when the first data segment cannot be recovered by coding; and writing a predetermined data into a most-significant-bit page corresponding to the first word line in the multi-level cell mode;

enabling the flash memory to operate in the SLC mode; and reading the page corresponding to the first word line again to obtain a second data segment.

24. The data reading method as claimed in claim 23, wherein the predetermined data is 0xFF.

25. The data reading method as claimed in claim 23, further comprising:

transmitting the second data segment to the host when the second data segment can be recovered by coding.

26. The data reading method as claimed in claim 23, further comprising:

marking the page corresponding to the first word line as a bad page when the second data segment cannot be recovered by coding.

27. The data reading method as claimed in claim 23, further comprising:

marking a first block corresponding to the first word line as a bad block when the second data segment cannot be recovered by coding.

28. A data reading method, applied to a data storage device, wherein the data storage device comprises a flash memory capable of operating in a SLC mode and a multi-level cell mode, the data reading method comprising:

performing a first read operation to read a page corresponding to a first word line of the flash memory in the SLC mode according to a read command of a host to obtain a first data segment;

writing a predetermined data into a most-significant-bit page corresponding to the first word line in the multi-level cell mode when the first data segment cannot be recovered by coding;

enabling the flash memory to operate in the multi-level cell mode when the first data segment cannot be recovered by coding;

writing a predetermined data into a most-significant-bit page corresponding to the first word line in the multi-level cell mode;

reading the page corresponding to the first word line in the SLC mode again to obtain a second data segment; and transmitting the second data segment to the host when the second data segment can be recovered by coding.

* * * * *